(12) United States Patent
Lim et al.

(10) Patent No.: US 11,990,574 B2
(45) Date of Patent: May 21, 2024

(54) METHOD FOR PRODUCING OPTOELECTRONIC SEMICONDUCTOR DEVICES AND OPTOELECTRONIC SEMICONDUCTOR DEVICE

(71) Applicant: OSRAM Opto Semiconductors GmbH, Regensburg (DE)

(72) Inventors: Choo Kean Lim, Jalan Tengku (MY); Xiao Fen Hoo, Ayer Itam (MY); Wan Leng Lim, George Town (MY); Ai Cheng Chan, Balik Pulau (MY)

(73) Assignee: OSRAM Opto Semiconductors GmbH, Regensburg (DE)

( * ) Notice: Subject to any disclaimer, the term of this patent is extended or adjusted under 35 U.S.C. 154(b) by 373 days.

(21) Appl. No.: 17/434,148

(22) PCT Filed: Mar. 8, 2019

(86) PCT No.: PCT/EP2019/055872
§ 371 (c)(1),
(2) Date: Aug. 26, 2021

(87) PCT Pub. No.: WO2020/182278
PCT Pub. Date: Sep. 17, 2020

(65) Prior Publication Data
US 2022/0165924 A1 May 26, 2022

(51) Int. Cl.
*H01L 21/683* (2006.01)
*H01L 25/075* (2006.01)
(Continued)

(52) U.S. Cl.
CPC .......... *H01L 33/60* (2013.01); *H01L 21/6835* (2013.01); *H01L 25/0753* (2013.01);
(Continued)

(58) Field of Classification Search
CPC ..... H01L 33/60; H01L 25/0753; H01L 33/50; H01L 33/54; H01L 33/58; H01L 2933/0058
See application file for complete search history.

(56) References Cited

U.S. PATENT DOCUMENTS 8,414,154 B2 * 4/2013 Dau ................. F21V 21/16
362/240
9,269,873 B2 * 2/2016 Imazu ................. H01L 33/486
(Continued)

FOREIGN PATENT DOCUMENTS

| EP | 3154095 A1 | 4/2017 |
| WO | 2016066476 A1 | 5/2016 |
| WO | 2018133940 A1 | 7/2018 |

*Primary Examiner* — Eugene Lee
(74) *Attorney, Agent, or Firm* — Slater Matsil, LLP

(57) ABSTRACT

In an embodiment, a method for producing optoelectronic semiconductor devices includes applying a temporal spacer to protect a light-exit face of an optoelectronic semiconductor chip by applying a photoresist onto a first carrier, subsequently developing the photoresist in places thereby forming the temporal spacer and subsequently mounting the optoelectronic semiconductor chip onto a side of the temporal spacer facing away from the first carrier, forming a reflector in a lateral direction directly around the optoelectronic semiconductor chip and around the temporal spacer, subsequently removing the temporal spacer so that the reflector extends beyond the light-exit face and applying an optical element onto the reflector so that a gap exists between the light-exit face and a light-entrance face of the optical element.

15 Claims, 13 Drawing Sheets

(51) Int. Cl.
*H01L 33/50* (2010.01)
*H01L 33/54* (2010.01)
*H01L 33/58* (2010.01)
*H01L 33/60* (2010.01)

(52) U.S. Cl.
CPC .............. *H01L 33/50* (2013.01); *H01L 33/54* (2013.01); *H01L 33/58* (2013.01); *H01L 2221/68354* (2013.01); *H01L 2221/68363* (2013.01); *H01L 2933/005* (2013.01); *H01L 2933/0058* (2013.01)

(56) References Cited

U.S. PATENT DOCUMENTS

| | | | |
|---|---|---|---|
| 2010/0171215 A1* | 7/2010 | Fischer | H01L 24/95 257/734 |
| 2010/0317132 A1* | 12/2010 | Rogers | H01L 21/6835 257/E33.059 |
| 2013/0187174 A1* | 7/2013 | Tischler | H01L 25/0753 257/80 |
| 2013/0264577 A1 | 10/2013 | Xu et al. | |
| 2017/0317251 A1* | 11/2017 | Sweegers | H01L 33/507 |
| 2018/0114887 A1 | 4/2018 | Herrmann et al. | |
| 2020/0119241 A1* | 4/2020 | Chong | H01L 33/58 |
| 2020/0203567 A1* | 6/2020 | Basin | H01L 33/502 |
| 2022/0336698 A1* | 10/2022 | Lerman | H01L 33/08 |
| 2023/0064207 A1* | 3/2023 | Hwang | H01L 25/162 |
| 2023/0207753 A1* | 6/2023 | Pinos | H01L 33/60 257/79 |

\* cited by examiner

METHOD FOR PRODUCING OPTOELECTRONIC SEMICONDUCTOR DEVICES AND OPTOELECTRONIC SEMICONDUCTOR DEVICE

This patent application is a national phase filing under section 371 of PCT/EP2019/055872, filed Mar. 8, 2019, which is incorporated herein by reference in its entirety.

TECHNICAL FIELD

A method for producing optoelectronic semiconductor devices is provided. Further, an optoelectronic semiconductor device is provided.

SUMMARY

Embodiments provide an optoelectronic semiconductor device comprising an efficient and space-saving optical element.

According to at least one embodiment, the method is to produce an optoelectronic semiconductor device. The optoelectronic semiconductor device is in particular a light-emitting diode that is configured to emit visible light in operation. As an alternative or in addition, near ultraviolet radiation and/or near infrared radiation may be emitted by the optoelectronic semiconductor device. Further, the optoelectronic semiconductor device could be a laser device. Moreover, it is possible for the optoelectronic semiconductor device to be a photodetector or a combined light-emitting and light-receiving element like a photosensor.

According to at least one embodiment, the method comprises the step of providing at least one optoelectronic semiconductor chip. The semiconductor chip or the semiconductor chips is/are a light-emitting diode chip, a laser diode chip or a photodetector chip. If there is a plurality of semiconductor chips, all semiconductor chips can be of the same construction or different kinds of semiconductor chips can be combined.

According to at least one embodiment, the method comprises the step of applying at least one temporal spacer. The spacer is configured to temporarily protect a light-exit face of the corresponding optoelectronic semiconductor chip. For example, the spacer is made of a photo resist. In the finished optoelectronic semiconductor device, the spacer is no longer present.

According to at least one embodiment, the method comprises the step of forming a reflector. Preferably, the reflector directly adjoins the optoelectronic semiconductor chip and/or the temporal spacer in a lateral direction. In particular, the reflector is formed directly on side faces of the optoelectronic semiconductor chip and of the temporal spacer. Preferably, the reflector completely and/or directly surrounds the optoelectronic semiconductor chip and the temporal spacer when seen in top view, in particular onto the light-exit face.

According to at least one embodiment, the method comprises the step of removing the temporal spacer. This method step is done after the reflector has been formed. Thus, after removing the spacer, the reflector proceeds beyond the light-exit face. Hence, a height of the reflector can exceed a height of the optoelectronic semiconductor chip.

According to at least one embodiment, the method comprises the step of applying an optical element onto the reflector. Thus, a gap is created between the light-exit face of the optoelectronic semiconductor chip and a light-entrance face of the optical element. Preferably, the optical element completely covers the light-exit face of the optoelectronic semiconductor chip.

In at least one embodiment, the method is for producing optoelectronic semiconductor devices and comprises the following steps:
A) providing an optoelectronic semiconductor chip,
B) applying a temporal spacer to protect a light-exit face of the optoelectronic semiconductor chip,
C) forming a reflector in a lateral direction directly around the optoelectronic semiconductor chip and around the temporal spacer,
D) subsequently removing the temporal spacer so that the reflector proceeds beyond the light-exit face, and
E) applying an optical element onto the reflector so that there is a gap between the light-exit face of the optoelectronic semiconductor chip and a light-entrance face of the optical element.

Typically, a phosphor layer is applied to a light-exit face of an LED chip and a reflector frame is formed around the LED chip, the phosphor covering the reflector frame. In order to achieve the desired optical characteristics, a comparably large external lens need to be placed above such an LED device.

With the method described herein, a space-saving meta lens or micro lens, for example, can be formed near the light-exit face atop the reflector. Thus, an optical element can be integrated in the optoelectronic semiconductor device in a space-saving manner.

Hence, a miniaturization of CSP with meta lenses and/or micro lenses is possible. CSP stands for "chip-scale package". Moreover, optical elements like meta lenses, micro lenses or Fresnel lenses can be used to enable applications for the optoelectronic semiconductor device like floor illumination or time-of-flight applications, ToF for short. The height of the gap can be adjusted by using different thicknesses of the temporal spacer in order to accommodate the distance required for advanced optics. Further, a simplified manufacturing process is enabled, in particular manufacturing of the optoelectronic semiconductor device in a panel is possible. Thus, manufacturing can be cheaper and faster. Flip chips can be used as optoelectronic semiconductor chips.

According to at least one embodiment, the optical element is a meta lens. A meta lens is a lens made of a meta material. A meta material includes structures like antennas, capacitors and/or coils or similar elements that have geometrical dimensions smaller than a wavelength that the optical element is designed for. For example, with such meta materials negative refractive indices can be realized. For example, the meta material and, thus, the meta lens comprises split-ring resonators and wires mounted on interlocking sheets.

According to at least one embodiment, the optical element is a micro lens or a micro lens array. That is, the optical element can be composed of a plurality of micro lenses. For example, the individual micro lenses can be formed as convex lenses or also as concave lenses. The micro lenses can be free form lenses. A shape of the micro lenses is preferably dome-like but cylindrical micro lenses can also be used. A mean diameter of the micro lenses is, for example, at least 10 µm or at least 50 µm and/or at most 500 µm or at most 200 µm or at most 100 µm when seen in top view onto a top face of the semiconductor device. For example, the number of micro lenses in the optical element is at least 9 or 16 or 25 and/or at most 100000 or at most 10000 or at most 1000 or at most 100.

According to at least one embodiment, the optical element is composed of micro prisms when seen in cross section.

Thus, the optical element can be a Fresnel lens or similar to a Fresnel lens. A mean width and/or height of the prisms is, for example, at least 10 µm or at least 50 µm and/or at most 500 µm or at most 200 µm or at most 100 µm when seen in cross section.

According to at least one embodiment, the optical element is flat. That is, the optical element can be approximated by a plane parallel platelet. Compared with lateral dimensions, the optical element can be comparably thin. For example, a quotient of the average diameter of the optical element and a thickness of the optical element is at least 3 or at least 5 or at least 10. As an alternative, or in addition, this quotient is at most 1000 or at most 100 or at most 20.

According to at least one embodiment, the reflector is produced by molding. Preferably, the reflector comprises a transparent matrix material like a silicone and also comprises reflective particles, for example of a metal oxide like titanium dioxide. It is possible that the reflector is diffusely reflective and/or is of white color. As an alternative, the reflector may be based on at least one metal or Bragg reflector and might be specularly reflective. Combinations of specularly and diffusely reflective components are also possible.

According to at least one embodiment, the gap is filled with a gas. For example, the gap is filled with a protective gas like nitrogen or argon. However, preferably the gap is filled with air. As an alternative, the gap can be an evacuated region.

According to at least one embodiment, method step B) is performed prior to method step A). That is, the temporal spacer is produced before the optoelectronic semiconductor chips are provided. Thus, the optoelectronic semiconductor chips can be placed onto the respective temporal spacer.

According to at least one embodiment, in method step B) a first carrier is provided. A raw material for the spacer is applied to the first carrier. The raw material is a photo resist, for example. The first carrier might include a first release tape.

According to at least one embodiment, step B) comprises the sub-step of developing the photo resist in places in order to define a shape of the temporal spacer. Superfluous raw material for the spacer can then be removed.

According to at least one embodiment, in method step A) the optoelectronic semiconductor chip is mounted on a side of the temporal spacer facing away from the first carrier. Mounting of the optoelectronic semiconductor chip might be realized by adhesively bonding the semiconductor chip onto the respective spacer. Thus, a glue can be located between the spacer and the optoelectronic semiconductor chip. As an alternative, the spacer might be glutinous by itself so that the optoelectronic semiconductor chip can be placed and temporarily bonded onto the spacer without the aid of a separate adhesive material.

According to at least one embodiment, method step B) comprises two sub-steps $B_1$) and $B_2$). In particular, method step A) is performed subsequent to method step $B_1$) but prior to method step $B_2$).

According to at least one embodiment, in method step $B_1$) a first carrier is provided onto which the photo resist is applied. Subsequently, the photo resist is developed in places and a first part of the temporal spacer is formed. The first part of the spacer might be congruent or approximately congruent with optoelectronic semiconductor chips subsequently mounted onto said first part.

According to at least one embodiment, in method step $B_2$) a further photo resist is applied around the first part, in particular by dispensing. The further photo resist preferably wets at least side faces of the first part. Optionally, the further photo resist wets side faces of the optoelectronic semiconductor chip completely or, preferably, only in part.

According to at least one embodiment, in method step $B_2$), the further photo resist is developed at least in places to form a second part of the temporal spacer. Thus, the second part of the spacer can be located alongside the semiconductor chip when seen in top view. When seen in cross-section, the second part of the spacer can have a trigonal or concave shape. Thus, the second part can be shaped like a meniscus.

According to at least one embodiment, prior to method step C), a second carrier is applied to a bottom side of the optoelectronic semiconductor chip. The second carrier can comprise a second release tape. The bottom side is opposite the light-exit face. It is possible that there are electric contact surfaces at the bottom side. The electric contact surfaces might be of one or more metals. The contact surfaces could be pressed into the second carrier, in particular into the second release tape.

According to at least one embodiment, after applying the second carrier, the first carrier is removed. This step is preferably done prior to method step C).

According to at least one embodiment, at least in an area atop the light-exit face, the gap is shaped like a truncated pyramid or like a truncated cone or as an intermediate between a truncated pyramid and a truncated cone. Otherwise, the gap can be shaped as a cuboid or as a combination of two or more than two cuboids.

According to at least one embodiment, in method step A) a plurality of the optoelectronic semiconductor chips is provided. In method step C), preferably exactly one mold body for all the reflectors is formed so that all the optoelectronic semiconductor chips are mechanically integrated and connected in said mold body.

According to one embodiment, in a further method step F) following method step E), the mold body is singulated into the individual reflectors. Thus, the reflectors and the optoelectronic semiconductor devices are created by singulation. The singulation is done, for example, by sawing or laser cutting.

According to at least one embodiment, in method step E) the optical elements are applied as an optical sheet. Preferably, the optical sheet is a continuous and contiguous layer that covers all the optoelectronic semiconductor chips prior to method step F). In addition, the mold body might also be partially or completely covered with the optical sheet.

According to at least one embodiment, in method step F) the optical sheet is singulated to the optical elements. The optical sheet as well as the mold body can be singulated in a simultaneous method or, as an alternative, in two successive method steps.

According to at least one embodiment, the gap completely proceeds through the reflector in a lateral direction. Thus, at least one air vent opening is formed. Through the air vent opening, a gas like air can get into the gap and out of the gap.

According to at least one embodiment, a shape of the at least one air vent opening is defined by a shape of the temporal spacer. That is, the reflector is formed around the temporal spacer and the temporal spacer can have wings that correspond to a negative shape of the air vent openings. Thus, after removing the temporal spacer, the gaps as well as the air vent openings are created.

According to at least one embodiment, at least two air vent openings are formed per gap and per semiconductor chip. The two air vent openings or at least two of the air vent openings can be arranged symmetrically when seen in a top view onto the light-exit face. There can be an axis of symmetry or there can be a point symmetry concerning the air vent openings.

According to at least one embodiment, the reflector and the optical element terminate flush with each other all around the finished semiconductor devices, in particular in a lateral direction. Thus, the optoelectronic semiconductor device can have planar side faces that consist of the reflector and of the optical element, and as an option additionally of an adhesive between the reflector and the optical element. Hence, the top face of the optical semiconductor device can solely be formed of the optical element.

According to at least one embodiment, a thickness of the gap exceeds a thickness of the optoelectronic semiconductor chip. In this case, the thickness of the gap is preferably at least 0.2 mm or 0.4 mm and/or at most 2 mm or at most 0.7 mm. Thus, the thickness of the gap is comparably large.

According to at least one embodiment, the thickness of the gap is comparably small. In particular, the thickness of the optoelectronic semiconductor chip then exceeds a thickness of the gap. In this case, the thickness of the gap might be at most 30 μm or at most 50 μm or at most 100 μm. As an alternative or in addition, the thickness of the gap is at least 2 μm or at least 5 μm or at least 10 μm.

According to at least one embodiment, the optoelectronic semiconductor chip is provided with, or includes, at least one phosphor. The at least one phosphor is configured to convert radiation emitted by the light-emitting semiconductor chip into radiation with another wavelength, in particular with a longer wavelength. There can be partial or complete wavelength conversion by means of the at least one phosphor. For example, mixed white light is created by blue light from the optoelectronic semiconductor chip and by yellow light from the phosphor.

According to at least one embodiment, the reflector completely and directly surrounds the phosphor in a lateral direction, preferably all around the phosphor when seen in top view onto the light-exit face. Preferably, the reflector projects beyond the phosphor in a direction away from the bottom side of the optoelectronic semiconductor chip. Thus, the gap is preferably located between the phosphor and the optical element.

Moreover, an optoelectronic semiconductor device is provided. The optoelectronic semiconductor device can be manufactured by a method as explained in one or more of the exemplary embodiments described above. Therefore, features for the optoelectronic semiconductor device are also disclosed for the method and vice versa.

In at least one embodiment, the optoelectronic semiconductor device comprises an optoelectronic semiconductor chip having a light-exit face or, as an alternative, a light-entrance face. A reflector proceeds beyond the light-exit face or the light-entrance face and directly surrounds the optoelectronic semiconductor chip in a lateral direction. An optical element is mounted onto the reflector so that there is a gap between the light-exit face or the light-entrance face and a light-entrance face of the optical element.

BRIEF DESCRIPTION OF THE DRAWINGS

A method and an optoelectronic semiconductor device described herein are explained in greater detail below by way of exemplary embodiments with reference to the drawings. Elements which are the same in the individual figures are indicated with the same reference signs. The relationships between the elements are not shown to scale, however, but rather individual elements may be shown exaggeratedly large to assist in understanding.

FIGS. 32 to 44 show method steps of an exemplary embodiment of a method described herein wherein FIGS. 36 and 42 are top views and the remaining FIGS. 32 to 35, 37 to 41, 43 and 44 are sectional views;

DETAILED DESCRIPTION OF ILLUSTRATIVE EMBODIMENTS

Figure 1:
FIGS. 1 to 13 show sectional views of method steps of an exemplary embodiment of a method described herein.

In FIGS. 1 to 13, an exemplary embodiment for a method to produce optoelectronic semiconductor devices 1 is illustrated. According to FIG. 1, a first carrier 61 is provided. The first carrier 61 can be a rigid body or can be a flexible foil.

Figure 2:

According to FIG. 2, a first release tape 71 is applied to the carrier 61. The release tape 71 is a thermal release tape, for example. Otherwise, the release tape 71 can be a radiation-sensitive release tape. That is, by means of heat and/or radiation, adhesive properties of the release tape 71 can be reduced.

Figure 3:
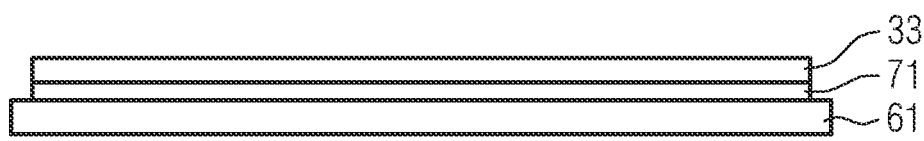

In the method step of FIG. 3, a photo resist 33 is applied directly to the first release tape 71. The photo resist 33 can be limited to the first release tape 71. The photo resist 33 can be a negative photo resist or can also be a positive photo resist.

Figure 4:
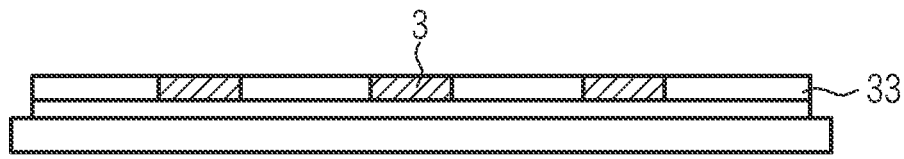

According to FIG. 4, the photo resist 33 is structured, for example by means of a masking technique and an illumination technique, not shown. Thus, temporal spacers 3 are created. The spacers 3 are in particular of hardened portions of the photo resist 33.

Figure 5:
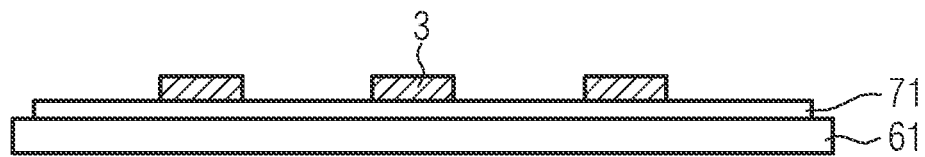

In FIG. 5 it is shown that not-hardened portions of the photo resist 33 are removed so that only the temporal spacers 3 remain on the first release tape 71.

Figure 6:
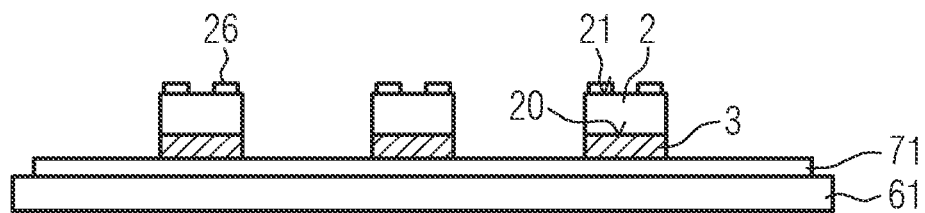

In the method step of FIG. 6, optoelectronic semiconductor chips 2 are applied to sides of the spacers 3 that are remote from the first release tape 71. The semiconductor chips 3 are, for example, light-emitting diode chips. A light-exit face 20 of the semiconductor chips faces the first release tape 71. A bottom side 21 faces away from the first release tape 71.

At the bottom side 21, the semiconductor chips 2 can comprise electric contact surfaces 26. That is, the semiconductor chips 2 can be flip chips having all electric contact surfaces 26 on the respective bottom side 21.

Figure 7:
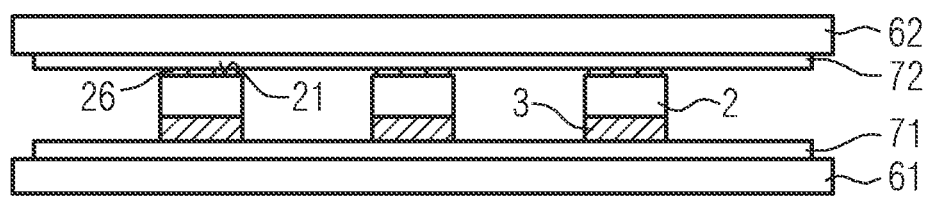

In the method step of FIG. 7, a second carrier 62 with a second release tape 72 is provided to the bottom sides 21 of the semiconductor chips 2. The second carrier 62 can be a rigid body or can be a flexible foil. The second release tape 72 can have adhesive properties in the same manner as the first release tape 71. Thus, the second release tape can be a thermal release tape or a radiation-sensitive release tape so that adhesive properties of the second release tape 72 can be switched off by heat and/or radiation, in particular by ultraviolet radiation.

As in all other exemplary embodiments, the electric contact surfaces 26 can touch the second release tape 72. As an alternative, the contact surfaces 26 can completely or partially be pressed into the second release tape 72. Thus, the bottom sides 21 of the semiconductor chips 2 can terminate flush with the second release tape 72 when the electric contact surfaces 26 are completely pressed into the second release tape 72. As an alternative, the semiconductor chips 2 themselves can be pressed partially into the second release tape 72.

Figure 8:
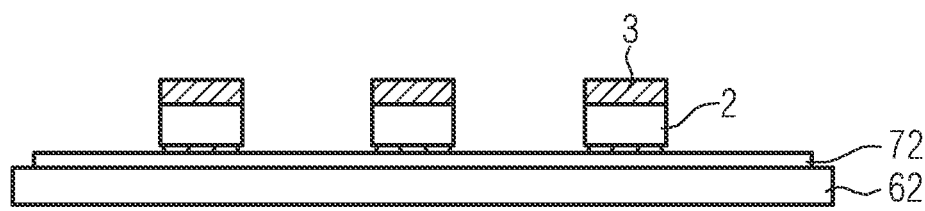

In FIG. 8 it is illustrated that the first carrier 61 and the second carrier 62 have been removed. Thus, the semiconductor chips 2 with the spacers 3 are located on the second carrier 62 with the second release tape 62.

Figure 9:
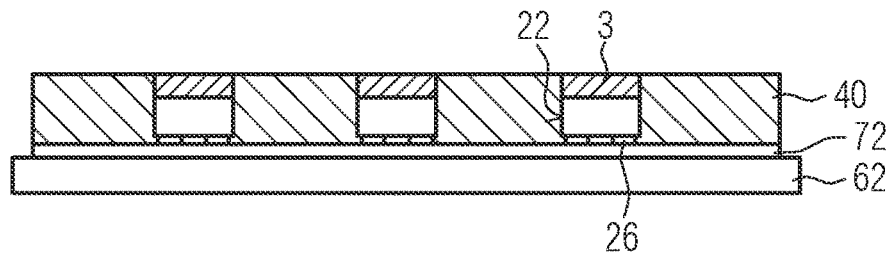

In the method step of FIG. 9, a mold body 40 is formed. The mold body 40 directly adjoins the semiconductor chips 2 at side faces 22 and also the spacers 3. The mold body 40 is directly applied on the second release tape 72. Depending on how far the semiconductor chips are pressed into the second release tape 72, the mold body 40 might touch the electric contact surfaces 26 or can terminate distant from the contact surfaces 26.

For example, the mold body 40 is formed by casting. As an alternative, the mold body 40 can be created by molding like film-assisted molding, FAM for short.

Preferably, the mold body 40 appears white. Thus, the mold body 40 is, for example, of a silicone into which reflective titanium dioxide particles have been embedded. In a direction away from the second release tape 72 and/or in a direction away from the second carrier 62, the mold body 40 can terminate flush with the spacers 3.

Figure 10:
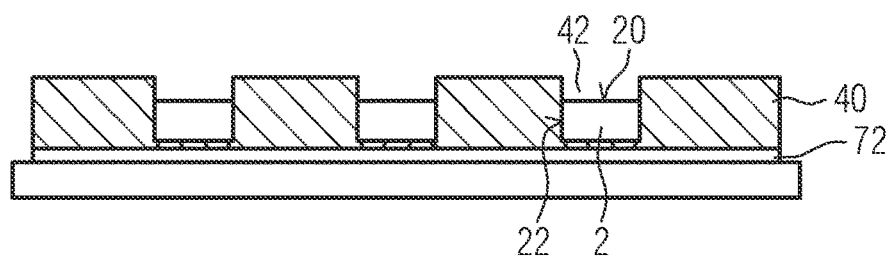

In the method step of FIG. 10, the spacers 3 have been removed. Thus, gaps 42 are created above the light-exit faces 20. In a lateral direction, the gaps 42 can terminate flush with the side faces 22 of the respective semiconductor chips 2.

Figure 11:
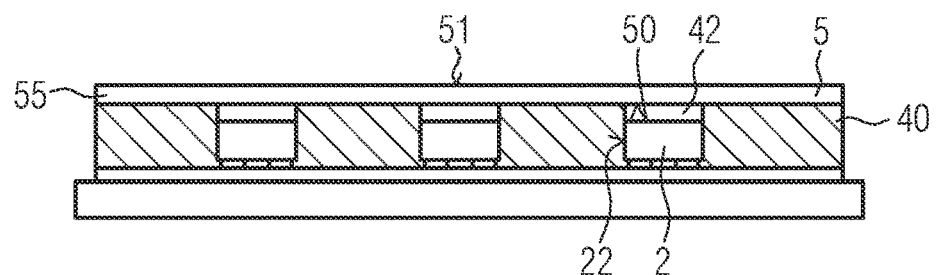

According to FIG. 11, a continuous optical sheet 55 is provided atop the mold body 40. The optical sheet 55 comprises a plurality of optical elements 5. Thus, the gaps 42 are completely covered by the optical elements 5. A light-entrance face 50 of the optical elements 5 faces the respective semiconductor chip 2 and a light-emitting surface 51 faces away from the semiconductor chips 2.

The optical sheet 55 might directly be applied to the mold body 40. As an alternative, there can be an adhesive layer, not shown, between the optical sheet 55 and the mold body 40.

Figure 12:
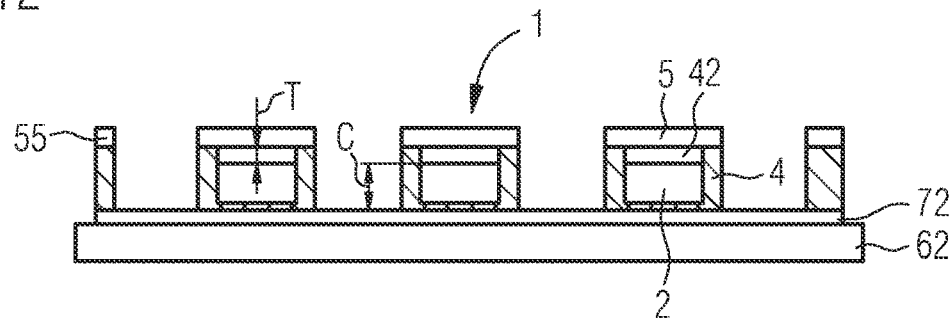

In FIG. 12 it is shown that the mold body 40 and the optical sheet 55 are singulated, for example by means of sawing. It is possible that the second carrier 62 and as an option the second release tape 72 are unaffected by the singulation step. Thus, by means of said singulation, individual reflectors 4 and individual optical elements 5 are created from the mold body 40 and from the optical sheet 55.

In FIG. 12 it is also illustrated that the gaps 42 have a comparably small thickness T. For example, the thickness T is around 50 μm. Compared with that, a thickness C of the semiconductor chips 2 is comparably large and might be around 0.2 mm.

Figure 13:
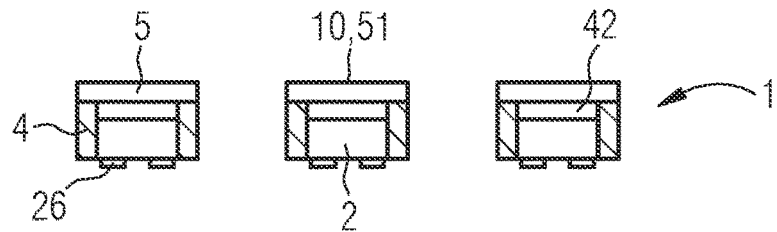

In FIG. 13, the finished optoelectronic semiconductor devices 1 are illustrated. Thus, the second release tape 72 and the second carrier 62 have been removed.

In FIGS. 14 to 18, another exemplary embodiment of the method is illustrated. The method of FIGS. 14 to 18 essentially corresponds to the method of FIGS. 1 to 13.

Figure 14:
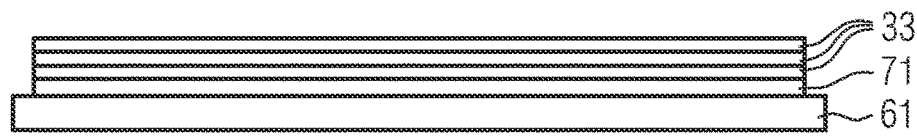
FIGS. 14 to 18 show sectional views of method steps of an exemplary embodiment of a method described herein.

According to FIG. 14, several photo resist layers 33 are applied, for example three photo resist layers 33.

Figure 15:
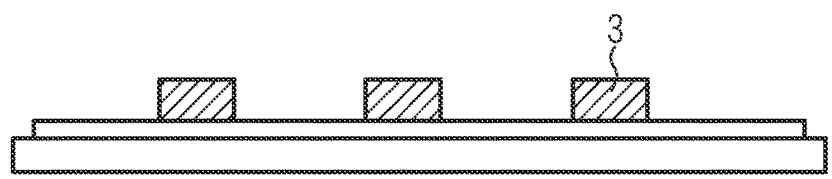

Thus, see FIG. 15, comparably thick temporal spacers 3 are achieved.

Figure 16:
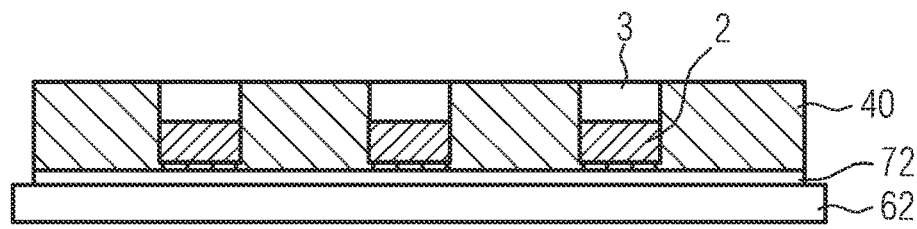

According to FIG. 16, the mold body 40 is produced analogous to the method step of FIG. 9.

Figure 17:
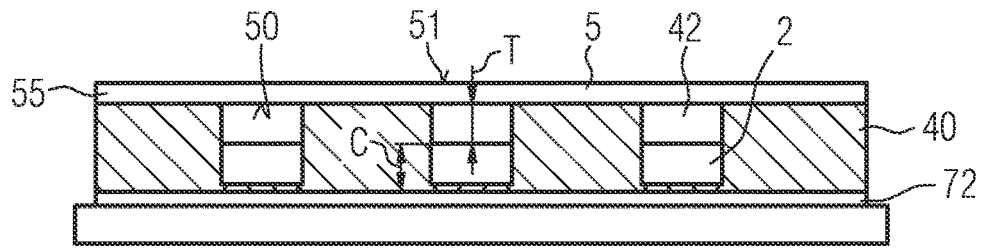

Following that, see FIG. 17, the optical sheet 55 comprising the optical elements 5 is attached to the mold body 40. As a consequence of the thick temporal spacers 3, comparably thick gaps 42 result. For example, the thickness T of the gaps exceeds a thickness C of the semiconductor chips 2. For example, the thickness T is around 1 mm.

Figure 18:
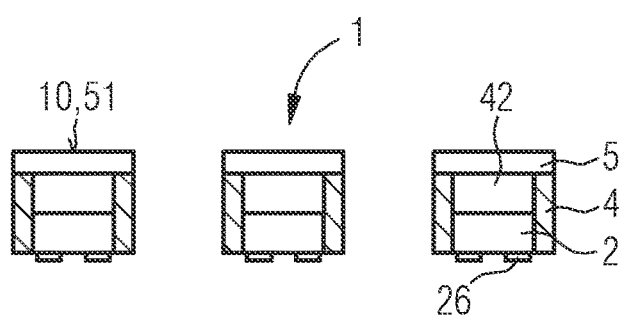
Figure 19:
FIGS. 19 to 31 show sectional views of method steps of an exemplary embodiment of a method described herein.
Figure 20:
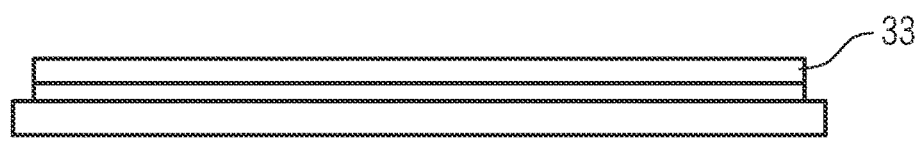
Figure 21:
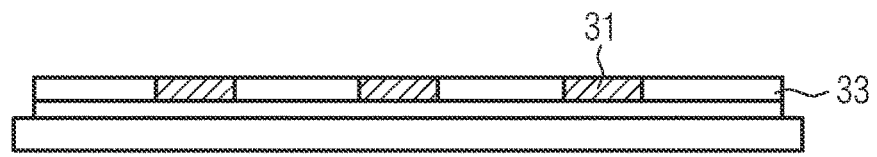
Figure 22:
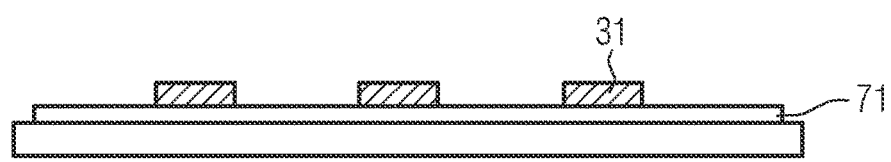

In FIG. 18, the resulting optoelectronic semiconductor devices 1 with the comparably thick gaps 42 are illustrated.

Figure 23:
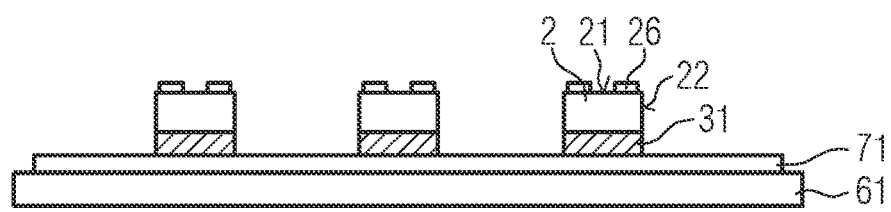

Another exemplary embodiment of the method is shown in FIGS. 19 to 31. The method steps of FIGS. 19 to 23 essentially correspond to the method steps of FIGS. 1 to 6. However, in FIG. 23 only first parts 31 of the spacers are present. These first parts 31 of FIG. 23 mostly correspond to the spaces 3 of FIG. 6.

Figure 24:
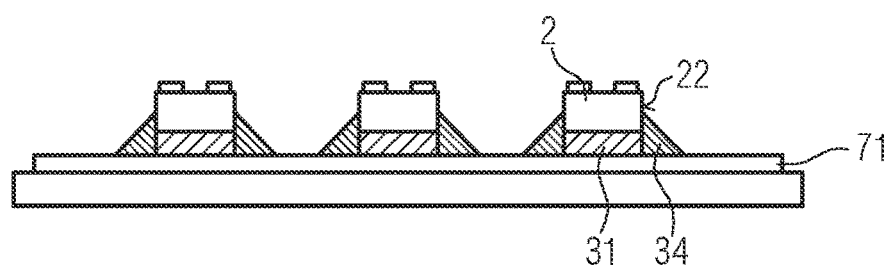

In the subsequent method step as shown in FIG. 24, second parts 33 of the spacers are created by dispensing a further photo resist 34 around the first parts 31 to the first release tape 71. The further photo resist 34 can wet the side faces 22 of the semiconductor chips 2 in part.

Figure 25:
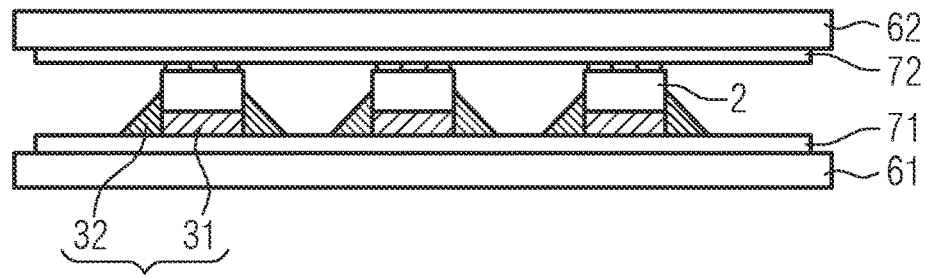

The resulting spacer 3 is shown in FIG. 25. That is, the spacer 3 has approximately the shape of a truncated pyramid with rounded corners.

Figure 26:
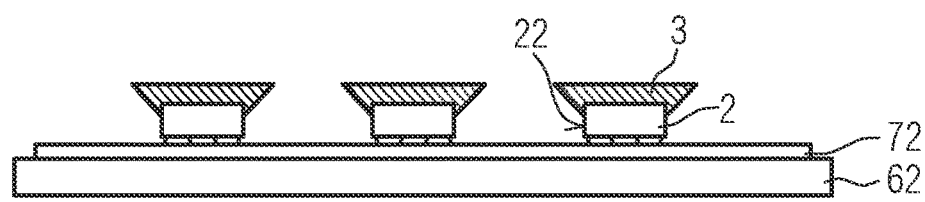

After removal of the first carrier 61 and the first release tape 71, see FIG. 26, the spacers 3 face away from the second carrier 62. In a direction away from the second carrier 62, the spacers 3 become broader.

Figure 27:
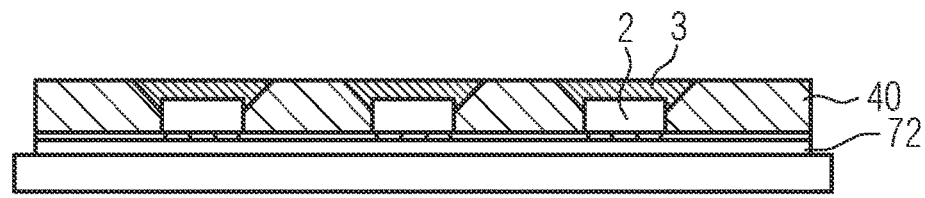

As shown in FIG. 27, the mold body 40 is created. Thus, negatives of the spacers 3 are formed in the mold body 40.

Figure 28:
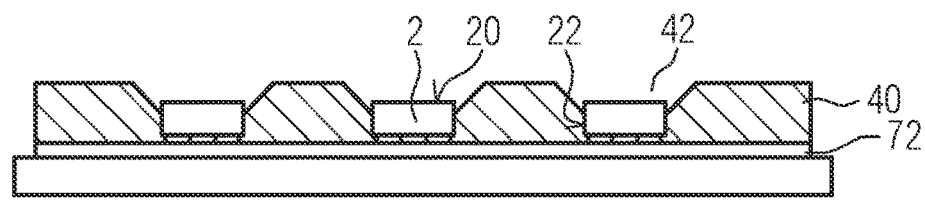

According to FIG. 28, the spacers 3 are removed. Hence, the light-exit faces 20 are completely free of the mold body 40 and the side faces 22 are partially free of the mold body 40. Thus, the resulting gaps 42 are shaped in a reflector-like manner and the gaps 42 become broader in a direction away from the associated semiconductor chip 2.

Figure 29:
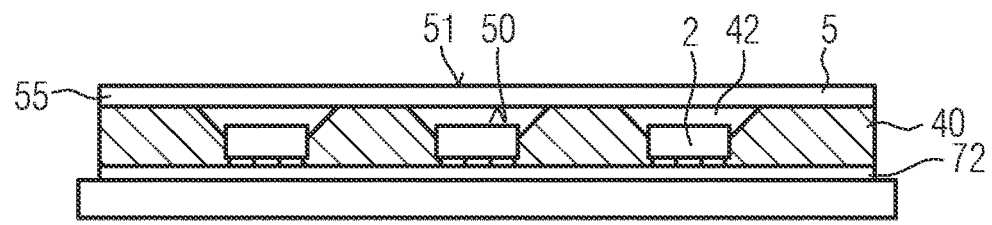
Figure 30:
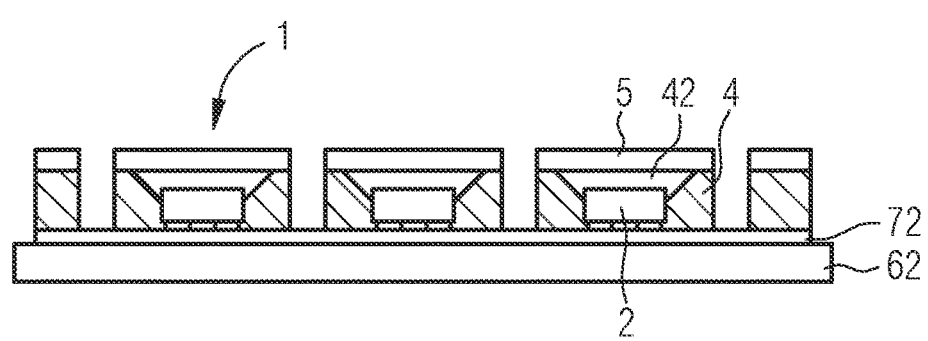
Figure 31:
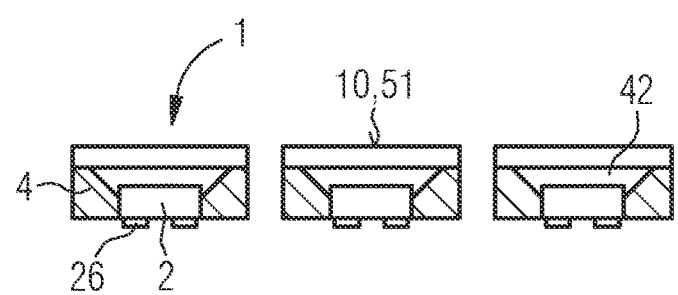
Figure 32:
Figure 33:
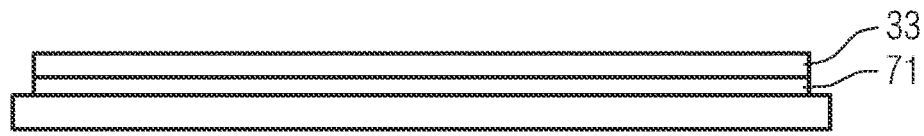
Figure 34:
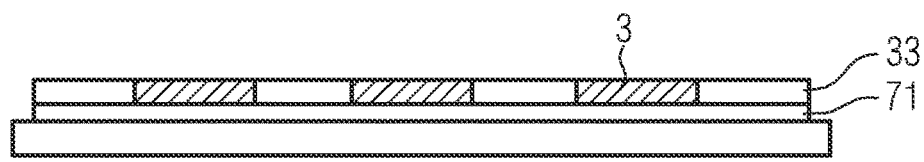
Figure 35:
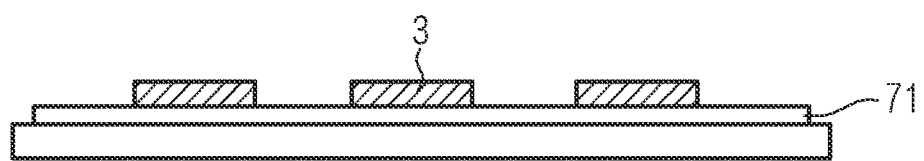

In the method steps of FIGS. 29 to 31, the optical sheet 55 is provided, singulation is performed and the second carrier 62 is removed. Thus, the method steps of FIGS. 29 to 31 are analogous to the method steps of FIGS. 11 to 13.

Another exemplary embodiment of the method is illustrated in FIGS. 32 to 44. The general concept of the method of FIGS. 32 to 44 is the same as in the method of FIGS. 1 to 13. Thus, essentially the differences to the aforementioned methods are explained in the following.

Figure 36:
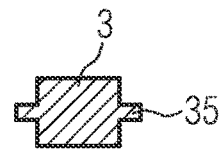
Figure 37:
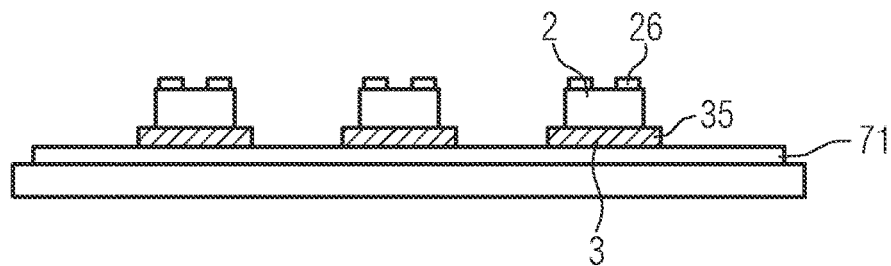
Figure 38:
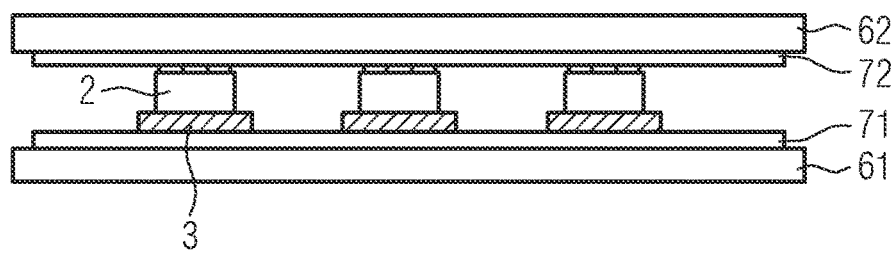
Figure 39:
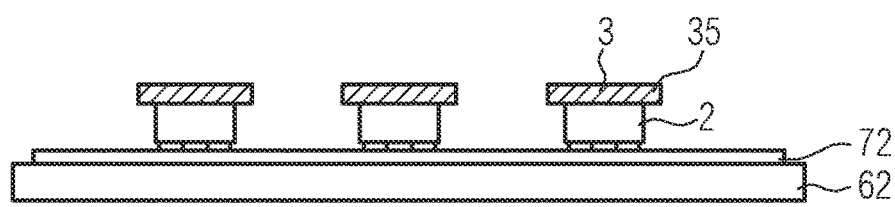
Figure 40:
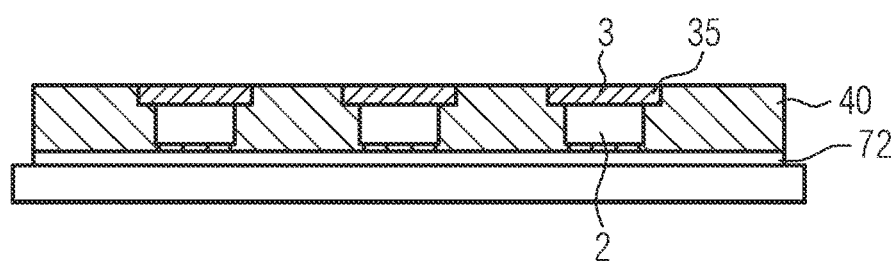
Figure 41:
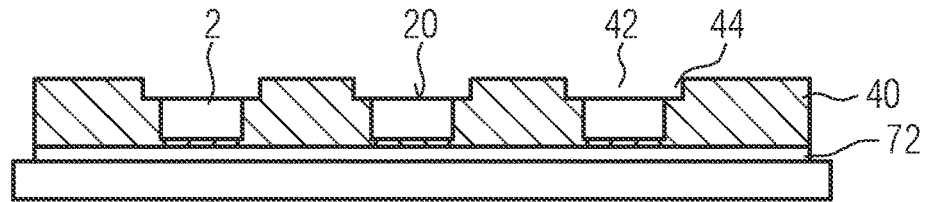

In FIG. 36 a top view of an individual spacer 3 is illustrated. The spacer 3 comprises a rectangular base body. Two wings 35 protrude from the base body at opposing sides. The wings 35 are of rectangular shape, for example. As can be seen from FIG. 37, the wings 35 protrude beyond the semiconductor chips 2 in a lateral direction. FIG. 37 and the subsequent sectional views are sectional views through a line along the wings 35.

Figure 42:
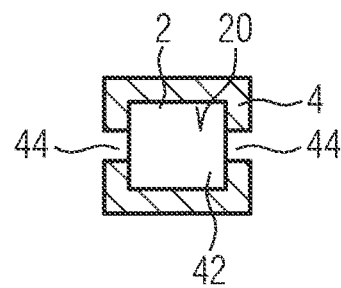
Figure 43:
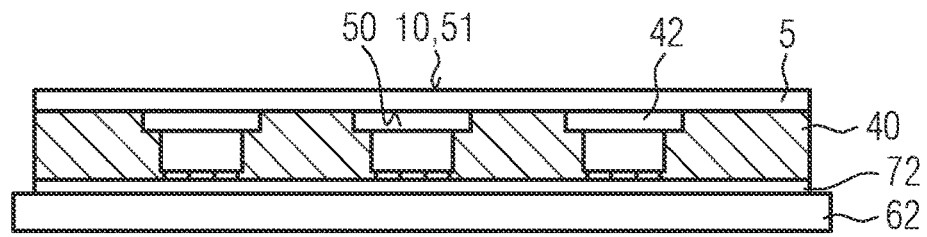
Figure 44:
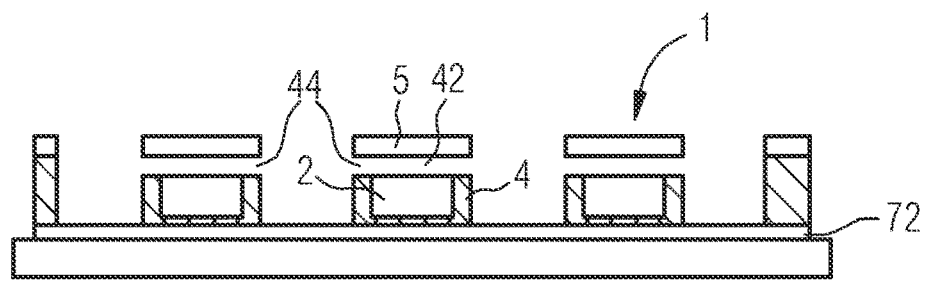

In FIGS. 31 and 42 it is illustrated that air vent openings 44 are created where the wings 35 have previously been located. Thus, see FIG. 44, the air vent openings 44 completely run through the associated reflector 4 in a lateral direction. Thus, air can flow into the gap 42 and out of the gap 42, depending for example on a temperature and, thus, on a density of the air in the gap 42.

Of course, the different thicknesses of the gap 42, air vent openings 44 and gaps 42 having a varying width can be combined within one exemplary embodiment of the method. For example, the air vent openings 44 of the devices of FIG. 44 can be combined with the broadening gap 42 of the exemplary embodiment of FIG. 31.

Figure 45:
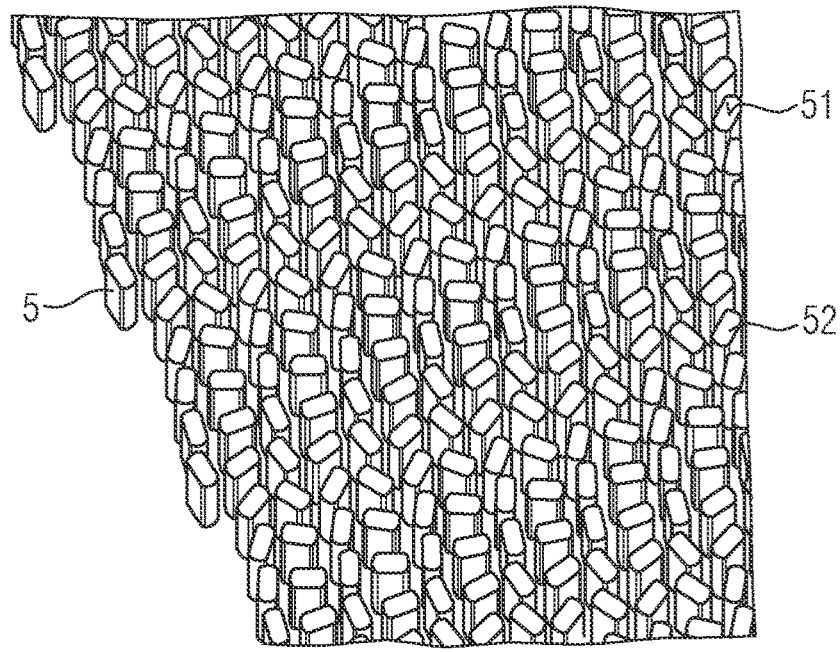
FIGS. 45 and 46 show schematic top views of exemplary embodiments of optical elements for optoelectronic semiconductor devices described herein.
Figure 46:
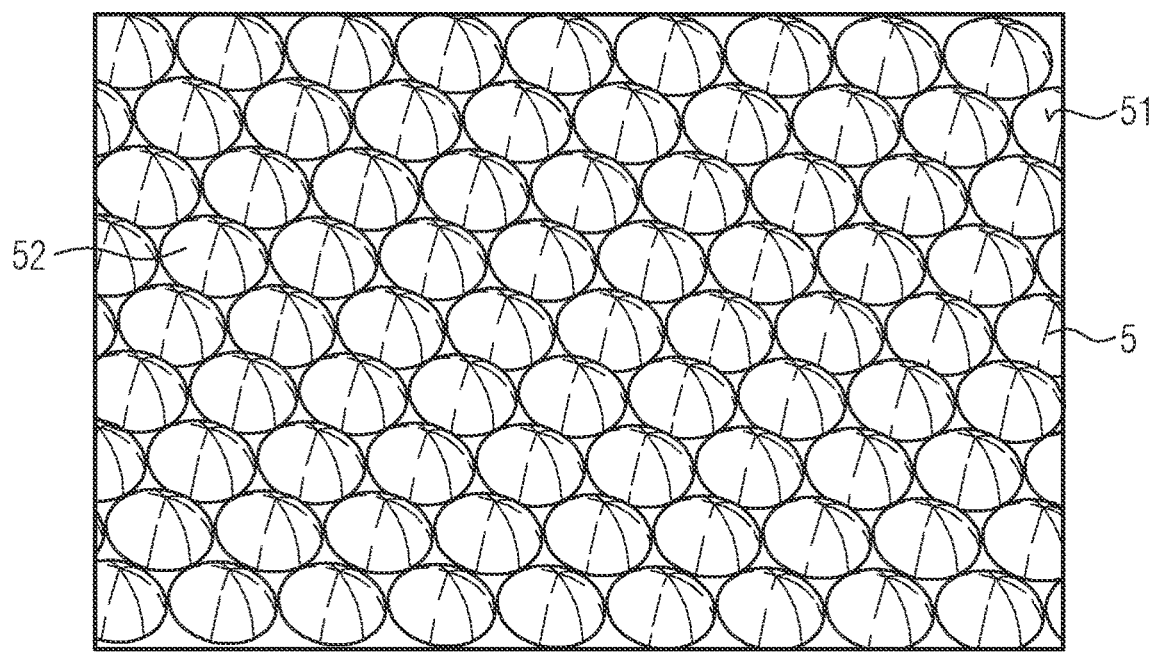

In FIGS. 45 and 46, top views onto the light-emitting surface 51 of the optical elements 5 are shown. According to FIG. 45, the optical element 5 comprises a plurality of structural elements 52. By means of the structural elements 52, a meta material is formed. Typical lateral dimensions of the structural elements 52 are smaller than a wavelength to be handled by the optical element 5. Thus, typical dimensions of the structural elements 52 might be around 100 nm to 500 nm.

According to FIG. 46, the optical element 5 is a micro lens array. Thus, a plurality of micro lenses 52 form the light-emitting surface 51.

As in all other exemplary embodiments, the light-entrance face 50 of the optical element 5 might be of planar fashion. As an alternative, the light-entrance face 50 might be provided with structural elements, micro lenses and/or Fresnel elements, too.

Figure 47:
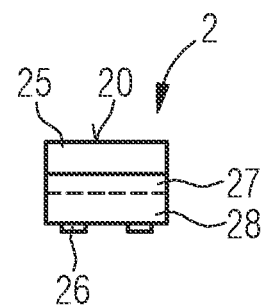
FIG. 47 shows a sectional view of an optoelectronic semiconductor chip for optoelectronic semiconductor devices described herein.

In FIG. 47, an exemplary embodiment of the semiconductor chip 2 is illustrated. The semiconductor chip 2 comprises a semiconductor layer sequence 27 which is configured to emit light. As an option, there is a substrate 28. The substrate 28 can be a growth substrate for the semiconductor layer sequence 27. Depending on the electrical properties of the substrate 28, the positions of the semiconductor layer sequence 27 and of the substrate 28 can be interchanged so that the electric contact surfaces 26 might be located directly on the semiconductor layer sequence 27. As mentioned, the substrate 28 might be omitted to create a thin-film semiconductor chip without a substrate.

The semiconductor layer 27 sequence is preferably based on a III-V compound semiconductor material. The semiconductor material is for example a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$, wherein in each case $0 \le n \le 1$, $0 \le m \le 1$ and $n+m \le 1$ applies. The semiconductor layer sequence may comprise dopants and additional constituents. For simplicity's sake, however, only the essential constituents of the crystal lattice of the semiconductor layer sequence are indicated, i.e. Al, As, Ga, In, N or P, even if these may in part be replaced and/or supplemented by small quantities of further substances. The semiconductor layer sequence is particularly preferably based on the AlInGaN material system.

As in all other exemplary embodiments, a phosphor layer 25 might be applied to the semiconductor layer sequence 27 and/or to the substrate 28. Thus, the phosphor 25 can be an integral part of the semiconductor chip 2. As an alternative, such a phosphor 25 can be a separate component within the optoelectronic semiconductor device 1, not shown.

The phosphor 25 is preferably a luminescent material or a luminescent material mixture comprising at least one of the following materials: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}$:RE with X=halide, N or divalent element, D=tri- or tetravalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as $(Ca,Sr,Ba)S:Eu^{2+}$; $Eu^{2+}$-doped SiONs such as $(Ba,Sr,Ca)Si_2O_2N_2:Eu^{2+}$; SiAlONs for instance from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$; nitrido-orthosilicates such as $AE_{2-x-a}RE_xEu_aSiO_{4-x}N_x$, $AE_{2-x-a}RE_xEu_aSi_{1-y}O_{4-x-2y}N_x$ with RE=rare earth metal and AE=alkaline earth metal; orthosilicates such as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM luminescent materials from the BaO—MgO—$Al_2O_3$ system such as $BaMgAl_{10}O_{17}:Eu^{2+}$; halophosphates such as $M_5(PO_4)_3(Cl,F):(Eu^{2+},Sb^{3+},Mn^{2+})$; SCAP luminescent materials such as $(Sr,Ba,Ca)_5(PO_4)_3Cl:Eu^{2+}$; KSF luminescent materials such as $K_2SiF_6:Mn^{4+}$. Quantum dots may moreover also be introduced as luminescent material. Quantum dots in the form of nanocrystalline materials which contain a group II-VI compound and/or a group III-V compound and/or a group IV-VI compound and/or metal nanocrystals, are preferred in this case.

Figure 48:
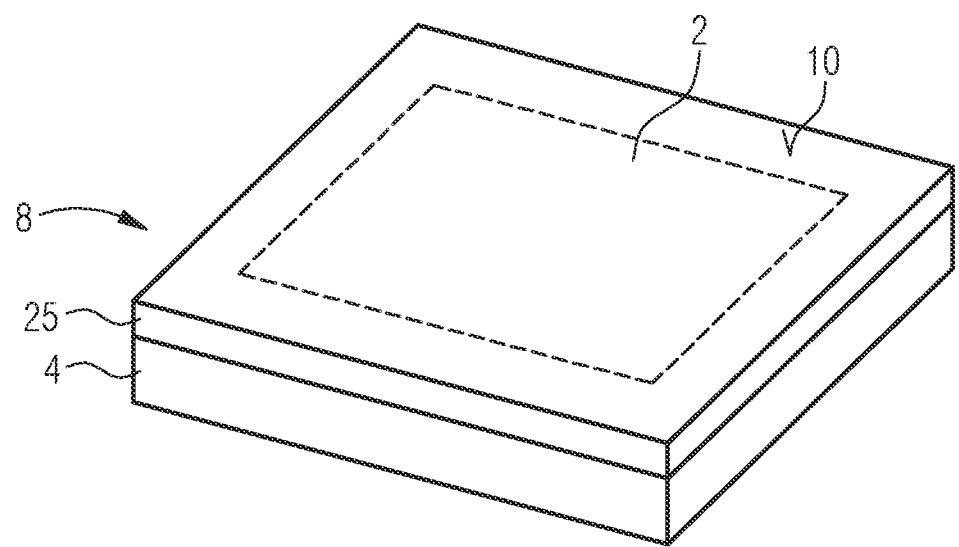
FIG. 48 shows a modification of an optoelectronic semiconductor device.

FIG. 48 illustrates a modification 8 of an optoelectronic semiconductor device. In this modification 8, the semiconductor chip 2 is laterally surrounded by the reflector 4. The reflector 4 and the semiconductor chip 2 are completely covered with the phosphor 25 that forms the top face 10 of the modification 8.

Using such a modification 8, comparably large optical elements, not shown, are required to achieve the desired optical properties. Contrary to that, with the optoelectronic semiconductor devices 1 as described herein, a space-saving arrangement concerning the optical element can be achieved.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing optoelectronic semiconductor devices, the method comprising:
   applying a temporal spacer to protect a light-exit face of an optoelectronic semiconductor chip by:
   applying a photoresist onto a first carrier;
   subsequently developing the photoresist in places thereby forming the temporal spacer; and
   subsequently mounting the optoelectronic semiconductor chip onto a side of the temporal spacer facing away from the first carrier;
   forming a reflector in a lateral direction directly around the optoelectronic semiconductor chip and around the temporal spacer;
   subsequently removing the temporal spacer so that the reflector extends beyond the light-exit face; and
   applying an optical element onto the reflector so that a gap exists between the light-exit face and a light-entrance face of the optical element.

2. The method according to claim 1,
   wherein the optical element is a meta lens or a micro lens array,
   wherein the reflector is produced by molding, is diffusely reflective and is of white color, and
   wherein the gap is filled with a gas.

3. The method according to one of claim 1, wherein, prior to forming the reflector, the method further comprises:
   applying a second carrier to a bottom side of the optoelectronic semiconductor chip, the bottom side being opposite the light-exit face; and
   subsequently removing the first carrier.

4. The method according to claim 1, wherein, at least in an area atop the light-exit face, the gap is shaped as a truncated pyramid or as a truncated cone or as an intermediate between the truncated pyramid and the truncated cone.

5. The method according to claim 1,
wherein the optoelectronic chip comprises a plurality of optoelectronic semiconductor chips,
wherein forming the reflector comprises forming exactly one mold body for all the reflectors so that all the optoelectronic semiconductor chips are mechanically integrated and connected in the mold body, and
wherein the method further comprises singulating the mold body to form individual reflectors.

6. The method according to claim 5,
wherein applying the optical element comprises applying the optical element as an optical sheet, the optical sheet being a contiguous layer that covers all the optoelectronic semiconductor chips prior to singulating, and
wherein singulating comprises singulating the optical sheet into optical elements.

7. The method according to claim 1,
wherein the gap completely proceeds through the reflector in a lateral direction so that at least one air vent opening is formed, and
wherein a shape of the at least one air vent opening is defined by a shape of the temporal spacer.

8. The method according to claim 7,
wherein at least two air vent openings are formed, and
wherein the two air vent openings or two of the air vent openings are arranged symmetrically when seen in top view onto the light-exit face.

9. The method according to claim 1, wherein the reflector and the optical element terminate flush with each other all around a finished optoelectronic semiconductor device so that a top face of the optoelectronic semiconductor device is solely formed by the optical element.

10. The method according to claim 1,
wherein a thickness of the gap exceeds a thickness of the optoelectronic semiconductor chip, and
wherein the thickness of the gap is at least 0.2 mm.

11. The method according to claim 1,
wherein a thickness of the optoelectronic semiconductor chip exceeds a thickness of the gap, and
wherein the thickness of the gap is at most 50 µm.

12. The method according to claim 1,
wherein the optoelectronic semiconductor chip is a light-emitting diode chip,
wherein the optoelectronic semiconductor chip comprises at least one phosphor configured to convert radiation emitted by the light-emitting diode chip into radiation with a longer wavelength, and
wherein the reflector completely and directly surrounds the phosphor in a lateral direction.

13. A method for producing optoelectronic semiconductor devices, the method comprising:
applying a temporal spacer to protect a light-exit face of an optoelectronic semiconductor chip by:
applying a first photoresist onto a first carrier;
subsequently developing the first photoresist in places thereby forming a first part of the temporal spacer;
subsequently mounting the optoelectronic semiconductor chip onto a side of the first part facing away from the first carrier;
subsequently dispensing a second photoresist around the first part, the second photoresist wetting at least side faces of the first part;
subsequently developing the second photoresist at least in places to form a second part of the temporal spacer;
forming a reflector in a lateral direction directly around the optoelectronic semiconductor chip and around the temporal spacer;
subsequently removing the temporal spacer so that the reflector extends beyond the light-exit face; and
applying an optical element onto the reflector so that a gap exists between the light-exit face and a light-entrance face of the optical element.

14. The method according to claim 13, wherein the second photoresist also wets side faces of the optoelectronic semiconductor chip at least in part.

15. The method according to one of claim 13, wherein, prior to forming the reflector, the method further comprises:
applying a second carrier to a bottom side of the optoelectronic semiconductor chip, the bottom side being opposite the light-exit face; and
subsequently removing the first carrier.

* * * * *